United States Patent [19]
Urakami et al.

[11] Patent Number: 4,958,354
[45] Date of Patent: Sep. 18, 1990

[54] APPARATUS FOR STABILIZING THE INTENSITY OF LIGHT

[75] Inventors: Tsuneyuki Urakami; Shinichiro Aoshima; Yutaka Tsuchiya, all of Shizuoka, Japan

[73] Assignee: Hamamatsu Photonics Kabushiki Kaisha, Shizuoka, Japan

[21] Appl. No.: 348,450

[22] Filed: May 8, 1989

[30] Foreign Application Priority Data

May 26, 1988 [JP] Japan .................. 63-129194

[51] Int. Cl.$^5$ .............................................. H01S 3/13
[52] U.S. Cl. ........................................ 372/29; 372/31; 372/38
[58] Field of Search .............................. 372/31, 29, 38

[56] References Cited

U.S. PATENT DOCUMENTS 3,898,583  8/1975  Shuey ........................ 331/94.5 S
4,736,164  4/1988  Henning .......................... 372/29

FOREIGN PATENT DOCUMENTS 1073979   6/1967  United Kingdom .
1511098   5/1978  United Kingdom .
1535544  12/1978  United Kingdom .
2048558A 12/1980  United Kingdom .

Primary Examiner—William L. Sikes
Assistant Examiner—Georgia Y. Epps
Attorney, Agent, or Firm—Finnegan, Henderson, Farabow, Garrett, and Dunner

[57] ABSTRACT

A light intensity stabilizing apparatus comprises an optical amplifier such as a non-resonant traveling-wave type optical amplifier, whose gain is adjustable by a controlling electrical signal and which amplifies incident light emitted from a light source, a beam splitting means for branching output light of the optical amplifier into stabilized output light and feedback light, a light intensity detector for converting said feedback light into an electrical signal, and a control unit for producing said controlling electrical signal in accordance with said electrical signal from said light intensity detector.

5 Claims, 5 Drawing Sheets

APPARATUS FOR STABILIZING THE INTENSITY OF LIGHT

BACKGROUND OF THE INVENTION

The present invention relates to an apparatus for stabilizing the intensity of light from a light source. More particularly, the present invention relates to an intensity stabilizing apparatus that is suitable for use with a light source which is incapable of direct modulation of light intensity.

The light emitted by a laser has a number of superior properties such as a high degree of collimation, high intensity and narrow spectral width. Because of these properties, lasers have been extensively used in physico-chemical experiments and in various industrial fields. However, in such laser applications as photometric calibration and high-precision measurements, fluctuations in the intensity of laser light can be a problem. Sources of such fluctuations are versatile; they may be variations in the power supply, changes in the length of resonator due to thermal causes, or variations caused by contention between modes. In gas lasers, plasma noise and unstable excitation of light are potential causes of fluctuations. In water-cooled lasers, microphonic noise which is generated by resonance in the flow of cooling water may cause intensity fluctuations. Dye lasers are highly susceptible to spike oscillation that may be caused by the formation of air bubbles in a dye solution or by inhomogeneity in dye concentration and the resulting variation in the intensity of laser light is usually no less than 10%.

If the light source with which stabilization in the intensity of light is required is a laser diode or some other device that is capable of direct modulation of light intensity, the intensity of light to be emitted can be converged to a target value by applying negative feedback to the drive unit for the light source, with part of the light from the light source being monitored. However, with other sources of laser light, the intensity of light to be emitted cannot be directly modulated and a separate means must be provided for stabilizing the intensity of emitted light.

FIG. 13 is a block diagram of an apparatus conventionally used to stabilize the intensity of light emitted from a light source. In this apparatus, light emanating from a light source 10 is passed through a polarizer 12 to extract light having a single component of the polarization plane. The extracted light is then launched into an optical modulator 14 such as a Pockels cell that is capable of controlling the state of polarization by means of an applied electrical signal. The light coming out of the optical modulator 14 is passed through an analyzer 16 and thence launched into a beam splitting means 18. The analyzer 16 detects light having a component of the polarization plane that crosses at a certain angle, typically at 90 degrees, with the component that is transmitted by the polarizer 12. The beam splitting means 18 divides the incident light into two light beams, one of which will be immediately produced as an output. The other is fed into a light intensity detector 20 and its intensity is detected. After being amplified in an amplifier 22 when necessitated, the light from the detector 20 is converted into a negative feedback signal in a control signal generator 24 and the signal is then applied to the optical modulator 14. The purpose of applying the negative feedback signal to the optical modulator 14 is to ensure that when the intensity of light is increased by Δi, the optical modulator 14 will rotate the polarization plane in such a direction as to reduce the intensity of light passing through the analyzer 16 by an amount corresponding to Δi.

However, this conventional apparatus for stabilizing the intensity of light has had the following problems. First, the need to use the polarizer 12 and analyzer 16 renders the optical system unduly complicated and increases the number of parts or components of the apparatus. Secondly, the optical modulator 14 has no amplifying capability and is solely intended to control light transmittance. Thus, as shown in FIG. 14, the output light from the apparatus becomes low in intensity and the maximum intensity of output light that can be obtained by stabilization is determined by the minimum intensity of laser light that is being subjected to fluctuations in intensity.

SUMMARY OF THE INVENTION

An object, therefore, of the present invention is to provide an apparatus that is simple in construction and which yet is capable of stabilizing the intensity of light from a light source without being limited by the minimum value of an intensity variation of the light source.

This object of the present invention can be attained by an apparatus for stabilizing intensity of light originally emitted from a light source, which apparatus comprises an optical amplifier that amplifies the light from the light source and whose gain is adjustable by an electrical signal, a beam splitting means that branches the amplified light into two light beams, a light intensity detector that detects one of the two light beams for generating an electrical signal, and a control unit that controls a gain of the optical amplifier in accordance with an output electrical signal from the light intensity detector.

In a preferred embodiment, the optical amplifier is designed as a non-resonant traveling-wave type optical amplifier having an anti-reflection coating formed on both ends of a semiconductor laser to prevent reflection from said ends.

In another preferred embodiment, the light intensity detector is designed as a photodetector capable of high-speed response which generates an electrical signal corresponding to the waveform of light intensity.

In still another preferred embodiment, the control unit includes an amplifier that amplifies the output electrical signal from the light intensity detector, a filter that cuts off the dc component of the output from the amplifier, a waveform signal generator that generates a reference signal having a predetermined waveform, and a subtractor that supplies the optical amplifier with a gain control electrical signal that corresponds to the difference between the outputs of the waveform signal generator and the filter.

DETAILED DESCRIPTION OF THE DRAWINGS

Figure 1:
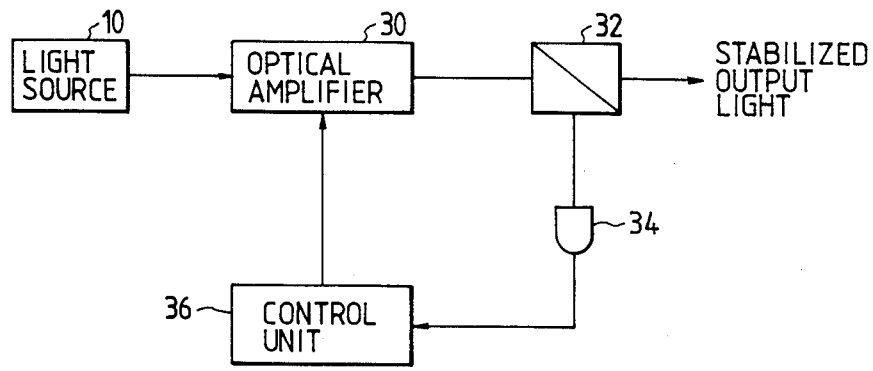
FIG. 1 is a block diagram showing the basic composition of an apparatus of the present invention.

The basic composition of the apparatus of the present invention is shown in FIG. 1. Light from a light source 10 which is to be stabilized in intensity is launched into an optical amplifier 30 whose gain is adjustable by an electrical signal. The light amplified in the optical amplifier 30 is fed into an beam splitting means 32 where it is branched into two light beams, one of which is outputted as a stabilized output. The intensity of the other light beam is detected in a light intensity detector 34 which then generates an electrical signal. The output electrical signal from the detector 34 is used to control the gain of the optical amplifier 30. Because of the absence of such optical parts as a polarizer and an analyzer, the apparatus of the present invention is simple in construction and can be reduced in size. As a further advantage, the apparatus is capable of not only stabilizing the intensity of input light but also its amplification, thus ensuring that the intensity of output light will not be limited by the minimum value of an intensity variantion of the light source.

The optical amplifier 30 that is capable of producing an optical output by amplifying input light by a factor that is dependent on an external electrical signal is available in various types including: a non-resonant traveling-wave type optical amplifier (TWA) which has an anti-reflection film coated on both end faces of a semiconductor laser to suppress reflection from those faces; a Fabry-Perot type optical amplifier (FPA) which uses a conventional semiconductor laser as an optical amplifier with it being biased below the threshold level for oscillation; an optical fiber Raman amplifier which utilizes Raman scattering induced in an optical fiber; an amplifier using a DFB laser; and an injection synchronous amplifier. Semiconductor amplifiers are advantageous because of their compactness and ease of control in operation.

Among semiconductor optical amplifiers, TWA and FPA are particularly advantageous. TWA has fast response to electrical signals and is capable of amplification of high speed optical signals. Because of the absence of resonator-dependent selectivity for wavelength, TWA has a broad (ca. 50 nm) wavelength range for gain and assures consistency in gain in the face of variations in the temperature of the amplifier or in the wavelength of incident light. TWA is also superior in terms of gain saturation and noise characteristics which are two important characteristics of an optical amplifier. On the other hand, FPA is easy to fabricate and allows a high gain to be attained in the neighborhood of a threshold value even with low current injection because it utilizes multiple reflections between both end faces to produce signal gain.

Another advantage of the semiconductor optical amplifiers is that their gain can be easily adjusted by changing the amount of injection current, so they can also be used as an optical switch by turning on or off the injection of current as in the present invention.

Figure 2:
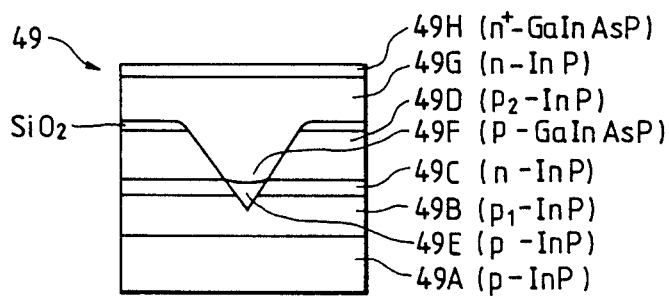
FIG. 2 is a cross section showing the illustrative composition of a semiconductor laser which is the main component of a traveling-wave type optical amplifier (TWA) used as an example of an optical amplifier in the apparatus of the present invention.

A TWA that is suitable for use in the present invention has an anti-reflection film coated on both end faces of a semiconductor laser 49 of the VIPS (V-grooved inner stripe on p-substrate) structure shown in FIG. 2, which may be formed by the following steps: in the first cycle of liquid-phase growth, a $p_1$-InP buffer layer 49B, n-InP block layer 49C and $p_2$-InP block layer 49D are grown on a p-InP substrate 49A; thereafter a V-shaped groove having a (111)B face is formed in 49B, 49C and 49D by wet etching, with a $SiO_2$ stripe mask being prepared by a conventional photolithographic process; and in the second cycle of liquid-phase growth, a p-InP cladding layer 49E, a p-type or undoped GaInAsP active layer 49F, n-InP cladding layer 49G and n+ —GaInAsP contact layer 49H are grown successively. The GaInAsP active layer 49F is formed at the bottom of the V-shaped groove, with its width and thickness being controlled to ca. 1.2 μm and ca. 0.10 μm, respectively. Thereafter, electrodes are formed and end faces are created by cleavage. An anti-reflection film is then deposited onto both end faces of the resulting semiconductor laser 49 using a material such as $SiO_2$ so as to fabricate a TWA. The semiconductor laser 49 of the VIPS structure has a sufficiently high efficiency of injection into the active layer to produce superior high output characteristics, so the TWA using this semiconductor laser also produces high gain and highly saturated output.

Figure 3:
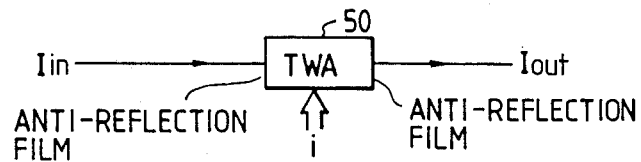
FIG. 3 is a diagram illustrating the operating characteristics of the TWA.
Figure 4:
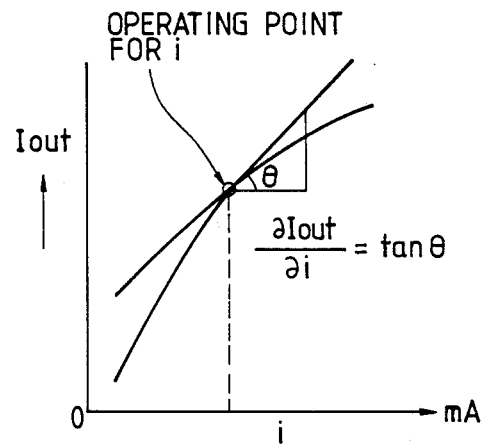
FIGS. 4 and 5 are diagrams illustrating two examples of the intensity characteristics of output light from the TWA.
Figure 5:
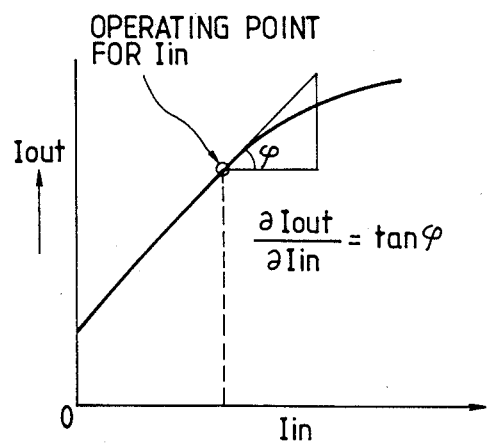

The TWA 50 thus fabricated has a basic composition as shown in FIG. 3. When the intensity of input light $I_{in}$ being launched into the TWA 50 is constant, the intensity of output light $I_{out}$ from the TWA 50 will change nonlinearly as shown in FIG. 4 in response to the change in input current i. If the value of input current i to the TWA 50 is constant, $I_{out}$ will change also nonlinearly as shown in FIG. 5 in response to the change in $I_{in}$. It can therefore be seen that when $I_{in}$ is constant, $I_{out}$ can be controlled by i, whereas $I_{out}$ can be controlled by $I_{in}$ when current i is constant. Needless to say, TWA 50 can be used as a linear amplifier in the linear portion of the operating range.

Figure 6:
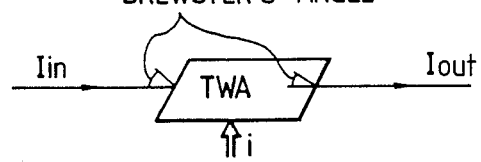
FIG. 6 is a schematic drawing of a modified version of the TWA.

In the TWA 50, reflection from both end faces is suppressed by the anti-reflection film coated thereon. It should, however, be noted that the anti-reflection film is not the sole mechanism for suppressing reflection from both end faces of the semiconductor laser and the same results can be attained by cutting each of the end faces at an angle equal to Brewster's angle as shown in FIG. 6. In this case, the plane of polarization is restricted but this fact may be an advantage rather than a disadvantage when a need arises for restricting the plane of polarization because this need can be met without employing any polarizer or analyzer.

Figure 7:
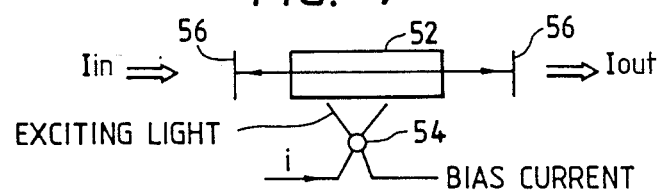
FIGS. 7-10 are schematic drawings showing other modifications of the optical amplifier used in the apparatus of the present invention.
Figure 8:
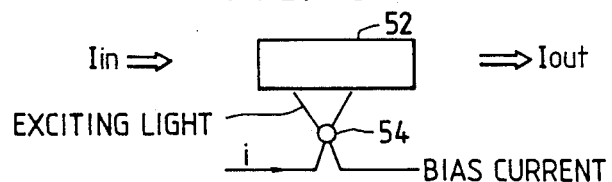

Besides the TWA 50 and FPA described above, other types of optical amplifier 30 can be used in the present invention, including the resonant optical amplifier shown in FIG. 7 which is biased to a level below the threshold for oscillation by imparting excitation light to a solid laser medium 52 with a laser diode 54, and the nonresonant optical amplifier shown in FIG. 8 that is similar to TWA in which reflection from both end faces of the solid laser medium 52 is suppressed by providing an antireflection film or adjusting the angle of each end face to be equal to Brewster's angle. In FIG. 7, the numeral 56 designates a resonant mirror. The laser diode 54 may or may not be supplied with a bias current for attaining a value in the neighborhood of the threshold level.

Figure 9:
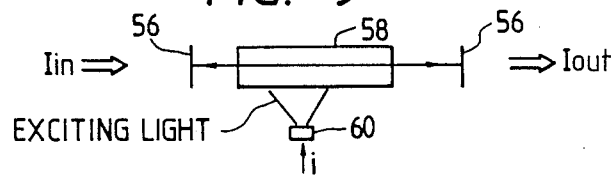

Another type of optical amplifier 30 that can be used in the present invention is shown in FIG. 9, in which a dye or gas laser medium 58 is excited with light from a semiconductor laser, light-emitting diode or current controlled lamp 60. Resonant mirrors 56 may be omitted from the system shown in FIG. 9.

Figure 10:
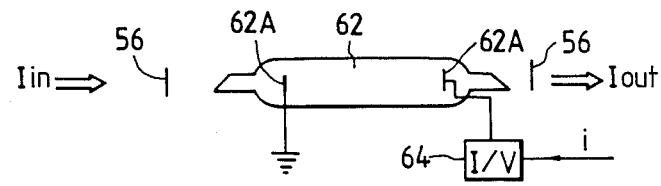

Still another type of optical amplifier 30 that can be used in the present invention is shown in FIG. 10, in which a gas laser medium 62 is excited by discharge, or the voltage applied between electrodes 62A from a current-to-voltage converter 64. Resonant mirrors 56 may be omitted from the system shown in FIG. 10.

Examples of the beam splitting means 32 that can be used in the present invention include a half mirror, a beam splitter, a cubic beam splitter and an optical fiber beam splitter.

The light intensity detector 34 may be in the form of a photodetector capable of high-speed response which generates an electrical signal corresponding to the waveform of light intensity. Examples of such fast response photodetectors include a photomultiplier tube, a photomultiplier tube having a built-in multichannel plate, and semiconductor photodetectors such as a photodiode and PIN photodiode. An advantage of using such photodetectors capable of high-speed response is that the frequency rang of the negative feedback system is expanded to eliminate fluctuations in the intensity of higher-frequency components. The use of semiconductor photodetectors such as a photodiode offers the added advantage of allowing for detection of infrared light.

Specific embodiments of the present invention are described below in greater detail with reference to the accompanying drawings.

A first embodiment of the present invention is generally an apparatus for stabilizing the intensity of light which, as shown in FIG. 1, comprises an optical amplifier 30, a beam splitting means 32, a light intensity detector 34 and a control unit 36. This embodiment is shown more specifically in FIG. 11; the TWA 50 is used as the optical amplifier 30 and the control unit 36 is composed of a current amplifier 80 for amplifying the output of the light intensity detector 34, a bias current source 82 for providing a reference value (constant value) for optical signal, and a subtractor 84 for supplying the TWA 50 with a gain control electrical signal that is produced by subtracting the output of the current amplifier 80 from the output of the bias current source 82.

The branching ratio of the beam splitting means 32 need not be 1:1 and if one wants a greater output of stabilized light, he may allow less than 50% of the input light to be branched toward the light intensity detector 34.

Figure 11:
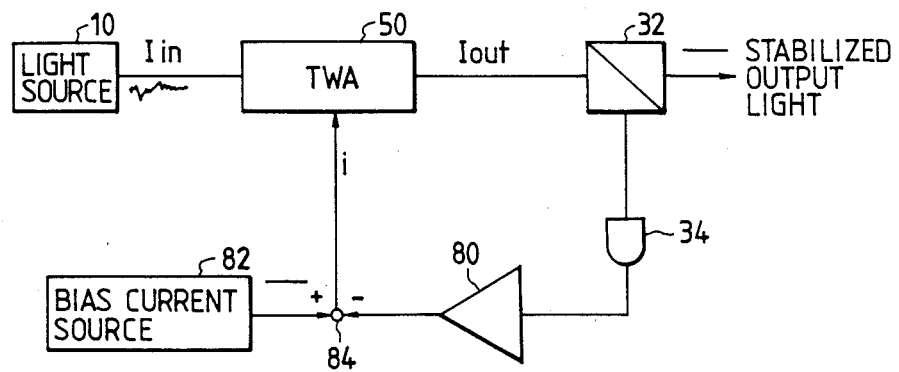
FIG. 11 is a block diagram showing the composition of an apparatus for stabilizing the intensity of light according to a first embodiment of the present invention.

The apparatus of the first embodiment shown in FIG. 11 operates as follows. Light emitted from the light source 10 and whose intensity is to be stabilized is launched into the TWA 50. The output light from the TWA 50 is branched by the beam splitting means 32 into two light beams, one of which is supplied to the light intensity detector 34 where it is converted into an electrical signal whose waveform is similar to that of the original light intensity. This electrical signal is amplified when necessitated by the current amplifier 80. The output from the current amplifier 80 is inverted and then combined with the output of the bias current source 82 and the sum is supplied as a gain control signal to the TWA 50. The circuit configuration described above forms a negative feedback system that is capable of stabilizing the output from the light source 10.

The current at the operating point of TWA 50 may be considered to be equivalent to the constant current from the bias current source 82 minus the dc component of the current-amplified signal.

The procedures for evaluating the control current are described below. The intensity of output light $I_{out}$ is a function of the intensity of input light $I_{in}$ and the control current i and may be expressed by:

$$dI_{out}(I_{in}, i)$$
$$=(\partial I_{out} / \partial I_{in})dI_{in}+(\partial I_{out} / \partial i)di. \ldots \quad (1)$$

If the intensity of output light is stabilized, $dI_{out}(I_{in}, i)$, which is a change in the intensity of output light, is zero. Then, $$(\partial I_{out} / \partial I_{in}) dI_{in}$$
$$= -(\partial I_{out} / \partial i)di. \ldots \quad (2)$$

Therefore, it is concluded that in order to achieve desired stabilization, one needs to produce a change in the control current that satisfies the following equation:

$$di = -(\partial i / \partial I_{out}) (\partial I_{out} / \partial I_{in}) dI_{in}. \ldots \quad (3)$$

Since $\partial i/\partial I_{out}$ and $\partial I_{out}/\partial I_{in}$ are uniquely determined if the operating points for control current and input light are respectively determined as shown in FIGS. 4 and 5, one may adjust the gain of the current amplifier 80 in such a way as to obtain di that satisfies equation (3).

In the first embodiment, the bias current source 82 is used because the control signal is a current. It should, of course, be understood that a bias voltage source may be used if the control signal is a voltage.

Figure 12:
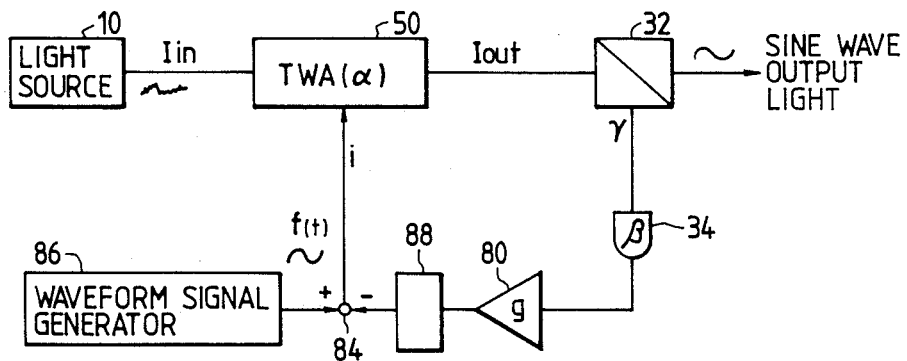
FIG. 12 is a block diagram showing the composition of an apparatus for stabilizing the intensity of light according to a second embodiment of the present invention.
Figure 13:
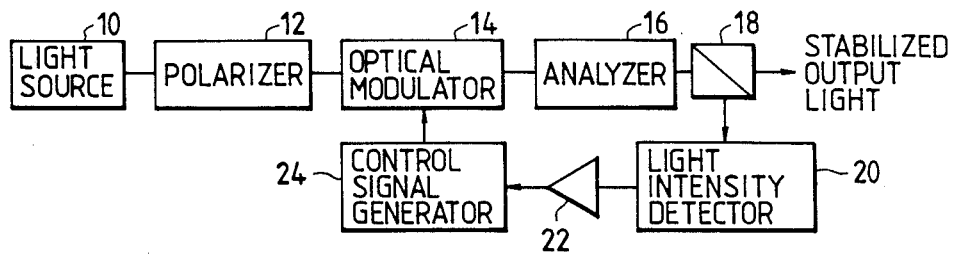
FIG. 13 is a block diagram showing the composition of a conventional apparatus for stabilizing the intensity of light.
Figure 14:
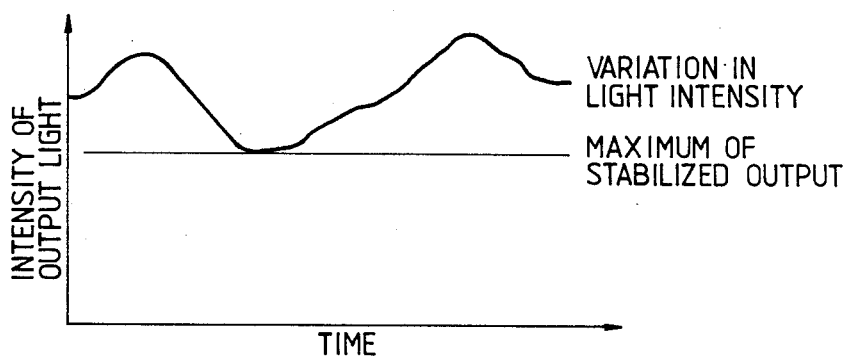
FIG. 14 is a diagram showing the operation of the conventional apparatus.

A second embodiment of the present invention is now described in greater detail with reference to FIG. 12. This embodiment is essentially the same as the first embodiment, except that the bias current source 82 is replaced by a waveform signal generator 86 that generates a reference signal which varies in accordance with a predetermined waveform (e.g. sine wave). Another difference is that a filter 88 for cutting off the dc component of the output from the current amplifier 80 is provided between the amplifier 80 and the subtractor 84.

In the second embodiment, the waveform signal generator 86 used in place of the bias current source 82 enables the outputting of light having a desired waveform that conforms to the waveform generated from said signal generator 86.

An optical output having a desired waveform can be obtained even if the feedback system is eliminated from the circuit configuration of the second embodiment. However, in this case, the intensity of output light ($I_{out}$) from the TWA 50 depends on both the intensity of input light $I_{in}$ and the control current i, so that any variation in the intensity of input light will be superposed on the intensity of output light. Therefore, in the second embodiment of the present invention, the feedback system is adopted in order to minimize the fluctuation that will be caused in the intensity of output light on account of a fluctuation in the intensity of input light.

The effect of the feedback system may be evaluated by the following procedures. In the absence of negative feedback, the intensity of output light $I_{out}$ from the TWA 50 is proportional to the intensity of input light $I_{in}$ as shown below:

$$I_{out} = I_{in} \cdot \alpha \cdot f(t) \ldots \quad (4)$$

where $\alpha$ is a gain of the TWA 50 and f(t) is an output signal from the waveform signal generator 86. If negative feedback is applied as in the second embodiment, the following equation holds:

$$I_{out} = I_{in} \cdot \alpha \cdot \{f(t) - I_{out} \cdot \gamma \cdot \beta \cdot g\} \ldots \quad (5)$$

where $\gamma$ is the proportion of the output of the beam splitting means 32 that is returned to the feedback system, $\beta$ is the quantum efficiency of photoelectric conversion in the light intensity detector 34, and g is the gain of the current amplifier 80.

If A is written for $\gamma \cdot \beta \cdot g$, we obtain:

$$\begin{aligned} I_{out} &= I_{in} \cdot \alpha \cdot \{f(t) - I_{out} \cdot A\} \\ &= \{I_{in} \cdot \alpha \cdot f(t)\}/(1 + I_{in} \cdot \alpha \cdot A). \end{aligned} \quad (6)$$

Therefore, if $I_{in} \cdot \alpha \cdot A$ is adjusted to be much greater than 1, the following equation holds and the intensity of output light $I_{out}$ from the TWA 50 becomes independent of the intensity of input light $I_{in}$:

$$\begin{aligned} I_{out} &\simeq \{I_{in} \cdot \alpha \cdot f(t)\}/(I_{in} \cdot \alpha \cdot A) \\ &= f(t)/A. \end{aligned} \quad (7)$$

Thus, by applying negative feedback, the influence of fluctuations in the input light can be reduced.

In the second embodiment described above, the dc cut-off filter 88 is inserted after the current amplifier 80, so that the operating point of the TWA 50 is uniquely determined by the output of the waveform signal generator 86, and the gain of the current amplifier 80 can be easily adjusted. The dc cut-off filter 88 may also be inserted into the circuit configuration of the first embodiment.

What is claimed is:

1. An apparatus for stabilizing intensity of light emitted from a light source to produce substantially constant-intensity light, comprising:
   an optical amplifier, having a gain which is adjustable by a controlling electrical signal, for amplifying incident light emitted from said light source;
   beam splitting means for branching said amplified incident light emitted from said light source into stabilized output light and feedback light;
   light intensity detecting means for converting said feedback light into an electrical signal; and
   control means for producing said control electrical signal in accordance with said electrical signal converted from said feedback light.

2. An apparatus as claimed in claim 1, wherein said optical amplifier is a non-resonant traveling-wave type optical amplifier comprising a semiconductor laser and an anti-reflection film which is coated on each of end faces of said semiconductor laser.

3. An apparatus as claimed in claim 1, wherein said light intensity detecting means is a photodetector which is capable of high-speed response and produces said electrical signal corresponding to a waveform of said feedback light.

4. An apparatus as claimed in claim 1, wherein said control means comprises:
   a bias signal source for producing a reference dc signal;
   an amplifier for amplifying said electrical signal from said light intensity detecting means;
   a subtractor for producing said controlling electrical signal by subtracting an output signal of said amplifier from said reference dc signal.

5. An apparatus as claimed in claim 1, wherein said control means comprises:
   a waveform signal generator for producing a reference signal having a predetermined waveform;
   an amplifier for amplifying said electrical signal from said light intensity detecting means;
   a filter for cutting-off a dc component of an output signal of said amplifier; and
   a subtractor for producing said controlling electrical signal by subtracting an output signal of said filter from said reference signal.

* * * * *